United States Patent
Lee et al.

(10) Patent No.: US 10,607,562 B2
(45) Date of Patent: Mar. 31, 2020

(54) VOLTAGE GENERATION CIRCUIT HAVING OVER-CURRENT PROTECTION FUNCTION AND DISPLAY DEVICE HAVING THE SAME

(71) Applicant: Samsung Display Co., Ltd., Yongin-Si, Gyeonggi-Do (KR)

(72) Inventors: Jongjae Lee, Hwaseong-si (KR); Dae-sik Lee, Hwaseong-si (KR); Yanguk Nam, Hwaseong-si (KR); Yoomi Kim, Hanam-si (KR); Songyi Han, Asan-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 19 days.

(21) Appl. No.: 15/904,722

(22) Filed: Feb. 26, 2018

(65) Prior Publication Data
US 2018/0308448 A1 Oct. 25, 2018

(30) Foreign Application Priority Data
Apr. 21, 2017 (KR) .................. 10-2017-0051846

(51) Int. Cl.
*G09G 3/36* (2006.01)
*H03K 5/1252* (2006.01)
(Continued)

(52) U.S. Cl.
CPC .......... *G09G 3/3696* (2013.01); *G09G 3/2092* (2013.01); *H03K 5/1252* (2013.01);
(Continued)

(58) Field of Classification Search
CPC .............. G09G 3/3696; G09G 3/2092; G09G 2330/04; G09G 2330/12; G09G 2330/045;
(Continued)

(56) References Cited

U.S. PATENT DOCUMENTS 8,487,924 B2* 7/2013 Jin ........................ G09G 3/20
323/282
8,946,994 B2 2/2015 Oh et al.
(Continued)

FOREIGN PATENT DOCUMENTS

| KR | 100999063 B1 | 12/2010 |
|----|--------------|---------|
| KR | 101492693 B1 | 2/2015 |
| KR | 1020170002098 A | 1/2017 |

*Primary Examiner* — Tom V Sheng
(74) *Attorney, Agent, or Firm* — Cantor Colburn LLP

(57) ABSTRACT

A voltage generation circuit of a display device includes an over-current detection circuit that provides a driving voltage to a voltage terminal and outputs an over-current detection signal. The over-current detection circuit includes a current detector that outputs a detection signal at a first level when a voltage corresponding to an output current flowing through the voltage terminal during a blank period, in which a blank signal is activated, is lower than a first reference level or higher than a second reference level, a glitch remover that outputs a noise detection signal when a time period in which the detection signal is maintained at the first level is longer than a reference maintenance time, and a noise filter that activates the over-current detection signal when the noise detection signal is activated at least twice during a predetermined time period.

20 Claims, 11 Drawing Sheets

(51) Int. Cl.
*H03K 5/24* (2006.01)
*G09G 3/20* (2006.01)
*H03K 21/08* (2006.01)

(52) U.S. Cl.
CPC ........... *H03K 5/24* (2013.01); *G09G 2330/04* (2013.01); *G09G 2330/12* (2013.01); *H03K 21/08* (2013.01)

(58) Field of Classification Search
CPC ........ H03K 5/1252; H03K 5/24; H03K 21/08; G06F 3/038
See application file for complete search history.

(56) References Cited

U.S. PATENT DOCUMENTS

| | | | |
|---|---|---|---|
| 9,058,773 B2* | 6/2015 | Park | G09G 3/3233 |
| 9,392,653 B2* | 7/2016 | Lee | H05B 33/0815 |
| 9,418,623 B2* | 8/2016 | Im | H05B 33/0827 |
| 9,558,692 B2* | 1/2017 | Kim | G09G 3/006 |
| 9,741,283 B2* | 8/2017 | Lee | H02H 3/087 |
| 2009/0219661 A1* | 9/2009 | Mitsuda | H03K 17/0822 |
| | | | 361/92 |
| 2012/0049829 A1* | 3/2012 | Murakami | H02M 1/32 |
| | | | 323/288 |
| 2014/0078629 A1* | 3/2014 | Cortigiani | H03K 17/0822 |
| | | | 361/79 |
| 2016/0111868 A1* | 4/2016 | Kawata | H02H 3/105 |
| | | | 361/79 |
| 2016/0379548 A1 | 12/2016 | Shin et al. | |

* cited by examiner

VOLTAGE GENERATION CIRCUIT HAVING OVER-CURRENT PROTECTION FUNCTION AND DISPLAY DEVICE HAVING THE SAME

This patent application claims priority to Korean Patent Application No. 10-2017-0051846, filed on Apr. 21, 2017, and all the benefits accruing therefrom under 35 U.S.C. § 119, the content of which in its entirety is herein incorporated by reference.

BACKGROUND

1. Field

Exemplary embodiments of the invention relate to a voltage generation circuit having an over-current protection function and a display device including the voltage generation circuit.

2. Description of the Related Art

In general, a display device includes a display panel for displaying an image and a driving circuit for driving the display panel. The display panel typically includes gate lines, data lines, and pixels. The driving circuit may generate various driving voltages to drive the display panel.

In such a display panel, a large number of gate lines and data lines are arranged in a limited space of the display panel. In such a display panel, the driving voltages applied to the gate lines and the data lines may have a high voltage level such that the image is displayed through the pixels.

In a case that power lines through which the driving voltages are transmitted are shorted to each other, an over-current flows through the power lines. As a result, the display panel may malfunction, and there may be a risk of fire.

SUMMARY

Exemplary embodiments of the invention provide a voltage generation circuit capable of detecting whether an over-current flows through a voltage terminal that outputs a driving voltage.

Exemplary embodiments of the invention provide a display device including the voltage generation circuit capable of detecting whether the over-current flows through the voltage terminal that outputs the driving voltage.

In an exemplary embodiment of the invention, a voltage generation circuit includes a voltage terminal which outputs a driving voltage, a voltage generator which generates an internal driving voltage, and an over-current detection circuit which converts the internal driving voltage to the driving voltage to provide the driving voltage to the voltage terminal and outputs an over-current detection signal. In such an embodiment, the over-current detection circuit includes a current detector which converts the internal driving voltage to the driving voltage to provide the driving voltage to the voltage terminal and outputs a detection signal at a first level when a voltage corresponding to an output current flowing through the voltage terminal during a blank period, in which a blank signal is activated, is lower than a first reference level or higher than a second reference level, a glitch remover which outputs a noise detection signal when a time period, during which the detection signal is maintained at the first level, is longer than a reference maintenance time, and a noise filter which activates the over-current detection signal when the noise detection signal is activated at least twice during a predetermined time period.

In an exemplary embodiment, the over-current detector includes a voltage output circuit which converts the internal driving voltage to the driving voltage at a constant level to provide the driving voltage at the constant level to the voltage terminal, a detection circuit which outputs a first detection voltage and a second detection voltage corresponding to the output current, and a protection circuit which outputs the detection signal at the first level when a voltage level of the first detection voltage is lower than the first reference level or when a voltage level of the second detection voltage is higher than the second reference level.

In an exemplary embodiment, the voltage output circuit includes a comparator which compares the internal driving voltage and the driving voltage and outputs an output voltage corresponding to a comparison result thereof through an output terminal thereof, a first output transistor including a first electrode which receives a first power voltage, a second electrode connected to the voltage terminal, and a gate electrode connected to the output terminal of the comparator, and a second output transistor including a first electrode connected to the voltage terminal, a second electrode connected to a ground terminal, and a gate electrode connected to the output terminal of the comparator.

In an exemplary embodiment, the detection circuit includes a first mirror transistor comprising a first electrode which receives a second power voltage, a second electrode, and a gate electrode which receives the output voltage, a first resistor connected between the second electrode of the first mirror transistor and the ground terminal, a second mirror transistor including a first electrode which receives the second power voltage, a second electrode, and a gate electrode connected to the second electrode, a second resistor connected between the second electrode of the second mirror transistor and the ground terminal, a third mirror transistor including a first electrode which receives the second power voltage, a second electrode connected to a first node, and a gate electrode connected to the gate electrode of the second mirror transistor, and a fourth mirror transistor including a first electrode connected to the first node, a second electrode connected to the ground terminal, and a gate electrode connected to the output terminal of the comparator. In such an embodiment, a voltage of the second electrode of the first mirror transistor is the first detection voltage, and a voltage of the second electrode of the second mirror transistor is the second detection voltage.

In an exemplary embodiment, the first mirror transistor has a channel length less than a channel length of the first output transistor.

In an exemplary embodiment, the protection circuit includes a first comparator which compares the first detection voltage with the first reference level and outputs a first comparison signal based on a comparison result thereof, a second comparator which compares the second detection voltage with the second reference level and outputs a second comparison signal based on a comparison result thereof, and a logic circuit which outputs the detection signal at the first level during the blank period when at least one of the first comparison signal and the second comparison signal is activated at the first level. In such an embodiment, the voltage generator stops generating the internal driving voltage in response to the over-current detection signal.

In an exemplary embodiment, the voltage generation circuit further includes a memory, and the over-current detection circuit outputs an over-current information signal corresponding to the voltage terminal through which an over-current flows, and the memory stores the over-current information signal.

In an exemplary embodiment, the glitch remover includes a delay circuit which receives the detection signal and outputs a delayed detection signal, where the delay detection signal is the detection signal, which is received after a masking delay time elapses from a time point at which the detection signal is activated, and a keeping counter which performs a count-up operation during a time period during which the delayed detection signal is maintained at the first level and outputs the noise detection signal when the counted value corresponds to a keeping time, and the keeping counter is reset when a time period, during which the delayed detection signal is not maintained at the first level, is equal to or longer than a predetermined time period.

In an exemplary embodiment, the noise filter includes a counter which receives a vertical start signal, performs a count-up operation in synchronization with the noise detection signal during a predetermined period of the vertical start signal, and activates the over-current detection signal when the counted value reaches a predetermined value.

In an exemplary embodiment, the current detector includes a voltage output circuit which converts the internal driving voltage to an output driving voltage at a constant level and outputs the output driving voltage to an output node, and a protection circuit connected between the output node and the voltage terminal, where the protection circuit outputs a detection signal at a first level when a voltage corresponding to the output current of the voltage terminal is lower than a first reference level or higher than a second reference level during the blank period.

In an exemplary embodiment, the protection circuit includes a first resistor connected between the output node and the voltage terminal, a second resistor connected between the output node and a first node, a third resistor connected between the first node and a ground terminal, a fourth resistor connected between the output node and a second node, a fifth resistor connected between the second node and the ground terminal, a first comparator which compares the first node and the second node and outputs a detection voltage based on a comparison result thereof, a second comparator which compares the detection voltage with the first reference level and outputs a first comparison signal based on a comparison result thereof, a third comparator which compares the detection voltage with the second reference level and outputs a second comparison signal based on a comparison result thereof, and a logic circuit which outputs the detection signal at the first level during the blank period when at least one of the first comparison signal and the second comparison signal is activated at the first level.

In an exemplary embodiment, the current detector includes a comparator which compares the internal driving voltage and the driving voltage, and outputs an output voltage based on a comparison result thereof, a first output transistor including a first electrode which receives a power voltage, a second electrode connected to the voltage terminal, and a gate electrode which receives the output voltage, a second output transistor including a first electrode connected to the voltage terminal, a second electrode connected to a ground terminal, and a gate electrode which receives the output voltage, a first comparator which compares a voltage of the first electrode of the first output transistor to a voltage of the second electrode of the first output transistor and outputs a detection voltage based on a comparison result thereof, a second comparator which receives the detection voltage to the second reference level and outputs a first comparison signal based on a comparison result thereof, a third comparator which receives a voltage of the first electrode of the second output transistor to the first reference level and outputs a second comparison signal based on a comparison result thereof, and a logic circuit which outputs the detection signal at the first level during the blank period when at least one of the first comparison signal and the second comparison signal is activated at the first level.

Embodiments of the invention provide a voltage generation circuit including a voltage terminal which outputs a driving voltage and a voltage generation unit which generates the driving voltage to the voltage terminal. In such an embodiment, the voltage generation circuit includes a voltage generator which generates an internal driving voltage and an over-current detection circuit which converts the internal driving voltage to the driving voltage to provide the driving voltage to the voltage terminal, detects an output current flowing through the voltage terminal, and outputs an over-current detection signal. In such an embodiment, the over-current detection circuit includes a voltage output circuit which converts the internal driving voltage to the driving voltage at a constant level and outputs the driving voltage at the constant level to the voltage terminal, a detection circuit which outputs a first detection current and a second detection current corresponding to the output current, and a protection circuit which outputs the over-current detection signal when the first detection current is lower than a first reference level or the second detection current is higher than a second reference level.

Embodiments of the invention provide a display device including a display panel including a plurality of gate lines, a plurality of data lines, and a plurality of pixels, each of which is connected to a corresponding gate line of the gate lines and a corresponding data line of the data lines, a gate driving circuit which drives the gate lines, a data driving circuit which drives the data lines, a driving controller which controls the gate driving circuit and the data driving circuit in response to a control signal and an image signal, which are provided thereto from an external source, and outputs a blank signal and a vertical start signal, and a voltage generation circuit which operates in synchronization with the blank signal and the vertical start signal and generates a driving voltage to drive the gate driving circuit and the data driving circuit. In such an embodiment, the voltage generation circuit includes a voltage terminal which outputs a driving voltage, a voltage generator which generates an internal driving voltage, and an over-current detection circuit which converts the internal driving voltage to the driving voltage to provide the driving voltage to the voltage terminal, detects an output current flowing through the voltage terminal during a blank period in which the blank signal is activated, and outputs an over-current detection signal. In such an embodiment, the over-current detection circuit includes a current detector which outputs a detection signal at a first level when a voltage corresponding to the output current is lower than a first reference level or higher than a second reference level, a glitch remover which outputs a noise detection signal when a time period, during which the detection signal is maintained at the first level, is longer than a reference maintenance time period, and a noise filter which activates the over-current detection signal when the noise detection signal is activated at least twice during a predetermined time period.

According to exemplary embodiments set forth herein, the display device including the voltage generation circuit that detects the over-current during the blank period, and thus the reliability of detecting the over-current may be improved regardless of the position of the shorted lines and the size of the display panel. In such embodiments, the glitch removing operation and the noise filtering operation are performed on the over-current detection signal, and thus the over-current protection function may be effectively prevented from malfunctioning.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1:
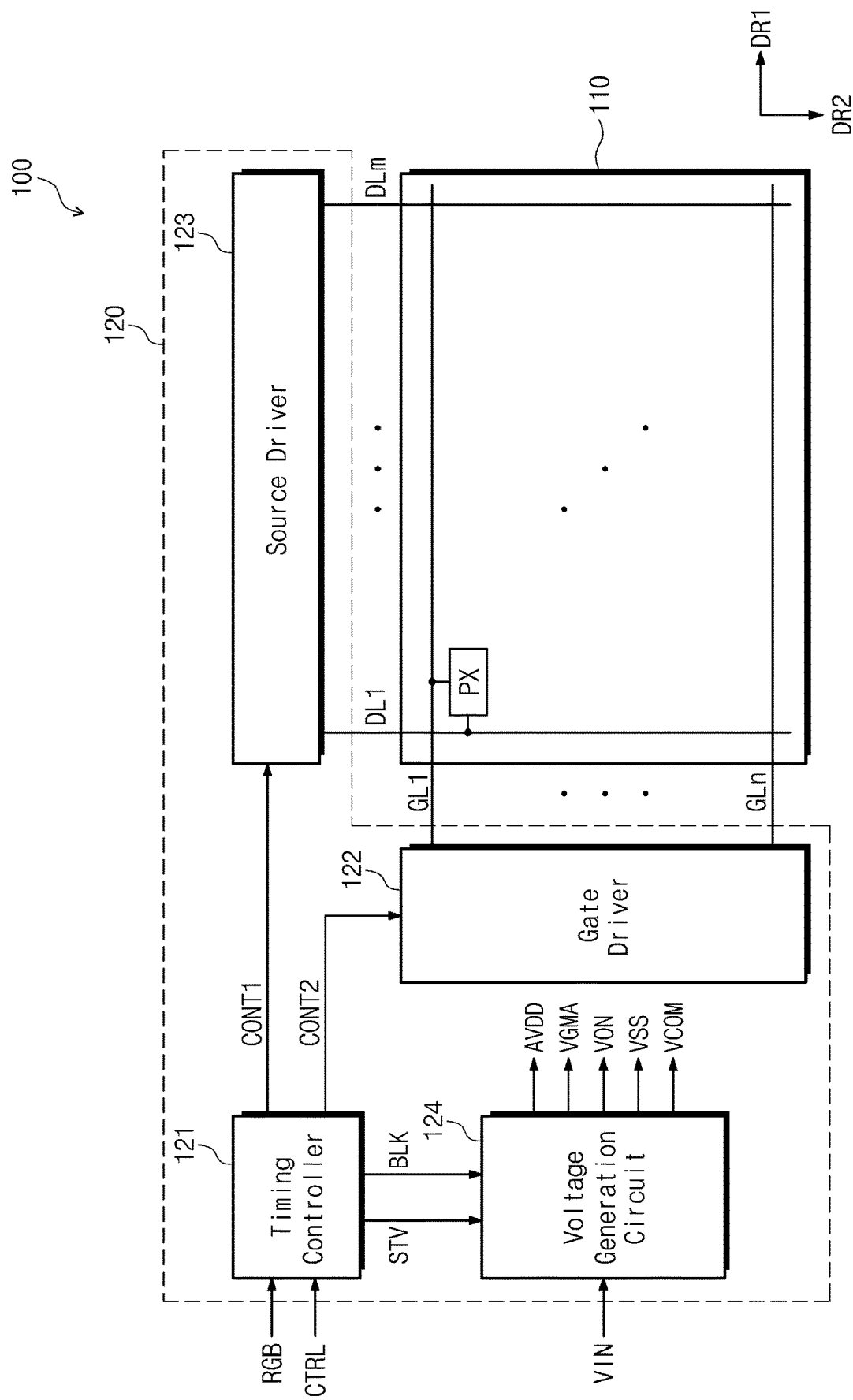
FIG. 1 is a block diagram showing a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the invention will be described in detail with reference to the accompanying drawings.

FIG. 1 is a block diagram showing a display device 100 according to an exemplary embodiment of the disclosure.

Referring to FIG. 1, an exemplary embodiment of the display device 100 includes a display panel 110 and a driving circuit 120. The driving circuit 120 includes a timing controller 121, a gate driver 122, a source driver 123, and a voltage generation circuit 124. The display device 100 may be, but not limited to, an organic light emitting display device or a liquid crystal display device. In an embodiment, where the display device 100 is the liquid crystal display device, the display device 100 may further include a backlight unit that provides a light to the display panel 100.

The display panel 100 includes a plurality of data lines DL1 to DLm, a plurality of gate lines GL1 to GLn arranged to cross the data lines DL1 to DLm, and a plurality of pixels PX connected the data lines DL1 to DLm and the gate lines GL1 to GLn. In one exemplary embodiment, for example, the pixels PX may be arranged in areas defined by the data lines DL1 to DLm and the gate lines GL1 to GLn. The gate lines GL1 to GLn extend in a first direction DR1 from the gate driver 122 and are sequentially arranged in a second direction DR2. The data lines DL1 to DLm extend in the second direction DR2 from the source driver 123 and are sequentially arranged in the first direction DR1. The data lines DL1 to DLm are insulated from the gate lines GL1 to GLn.

In such an embodiment, although not shown in figures, each of the pixels PX includes a switching transistor connected to a corresponding data line among the data lines DL1 to DLm and a corresponding gate line among the gate lines GL1 to GLn, and a liquid crystal capacitor and a storage capacitor, which are connected to the switching transistor.

The timing controller 121 receives an image signal RGB and a control signal CTRL from an external source (not shown). The timing controller 121 applies a first control signal CONT1 to the source driver 123 and a second control signal CONT2 to the gate driver 122. The timing controller 121 may apply the first control signal CONT1 to the source driver 123 in a clock embedded interface manner. The first control signal CONT1 includes an image data signal and a clock signal. The first control signal CONT1 may further include a polarity control signal and a load signal.

The source driver 123 drives the data lines DL1 to DLm in response to the first control signal CONT1 from the timing controller 121. The source driver 123 may be electrically connected to one side portion of the display panel 110. In an exemplary embodiment, the source driver 123 may be in the form of an independent integrated circuit and directly mounted on the display panel 110. In addition, the source driver 123 may be implemented in a single chip or may include a plurality of chips.

The gate driver 122 drives the gate lines GL1 to GLn in response to the second control signal CONT2 from the timing controller 121. The gate driver 122 may be in the form of an independent integrated circuit and electrically connected to one side portion of the display panel 110. In an exemplary embodiment, the gate driver 122 may be integrated in a predetermined area of the display panel 110 in the form of a circuit with an amorphous silicon gate ("ASG") using an amorphous silicon thin film transistor ("a-Si TFT"), an oxide semiconductor, a crystalline semiconductor, a polycrystalline semiconductor, or the like. According to an alternative embodiment, the gate driver 122 may be in the form of a tape carrier package ("TCP") or a chip-on-film ("COF").

In such an embodiment, switching transistors, which are respectively corresponding to the pixels arranged in one row and connected to one gate line among the gate lines GL1 to GLn, are turned on when a gate-on voltage is applied to the one gate line. In such an embodiment, the source driver 123 applies data driving signals corresponding to the image data signal included in the first control signal CONT1 to the data lines DL1 to DLm. The data driving signals applied to the data lines DL1 to DLm are applied to the pixels PX through the turned-on switching transistors.

The voltage generation circuit 124 receives a power voltage VIN from an external source and generates various driving voltages, e.g., an analog power voltage AVDD, a gamma voltage VGMA, a gate-on voltage VON, a ground voltage VSS, a common voltage VCOM, etc., which are required for operations of the source driver 123, the gate driver 122, and the display panel 110. In an exemplary embodiment, as shown in FIG. 1, the voltage generation circuit 124 may generate five driving voltages, but not being limited thereto. In an alternative exemplary embodiment, the voltage generation circuit 124 may further generate other driving voltages, such as a power voltage applied to the timing controller 121, a storage voltage applied to a storage capacitor (not shown) of the display panel 110, a gate-off voltage applied to the gate driver 122, etc.

The timing controller 121 may further generate a vertical start signal STV and a blank signal BLK. The vertical start signal STV may be included in the second control signal CONT2 applied to the gate driver 122 from the timing controller 121.

The voltage generation circuit 124 may generate the driving voltages in response to the vertical start signal STV and the blank signal BLK from the timing controller 121. The vertical start signal STV indicates a start of each frame, and the blank signal BLK indicates an active state (e.g., a low level) during a blank period in which the source driver 123 and the gate driver 122 do not operate, that is, do not drive the data lines DL1 to DLm and the gate lines GL1 to GLn within each frame.

The voltage generation circuit 124 may further include voltage terminals (not shown) to output the various driving voltages, e.g., the analog power voltage AVDD, the gamma voltage VGMA, the gate-on voltage VON, the ground voltage VSS, the common voltage VCOM, etc.

Figure 2:
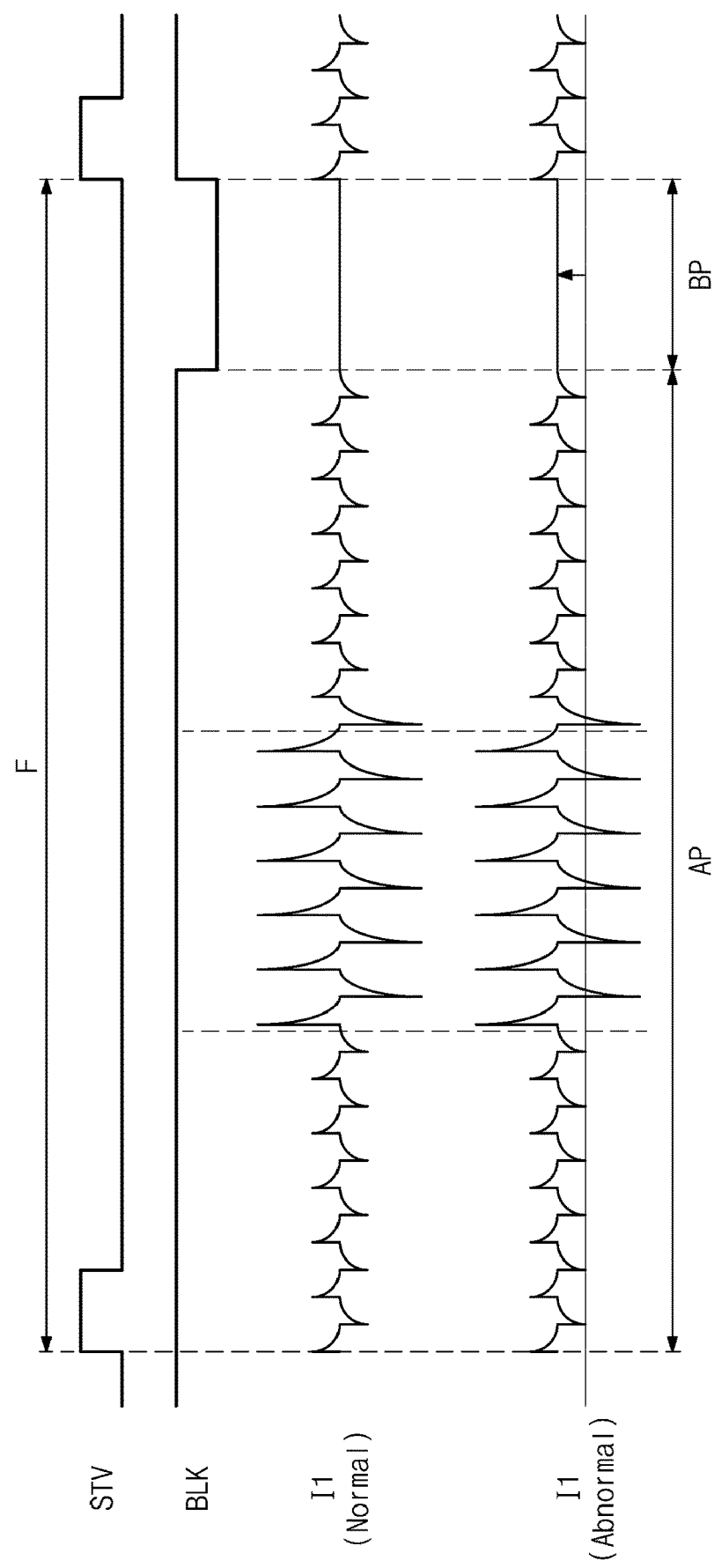
FIGS. 2 and 3 are views showing a normal state of a current flowing through a voltage terminal of a voltage generation circuit and an abnormal state caused by an over-current.

FIG. 2 is a view showing a normal state of a current flowing through a voltage terminal of a voltage generation circuit, which outputs the gate-on voltage, and an abnormal state caused by an over-current.

Figure 3:
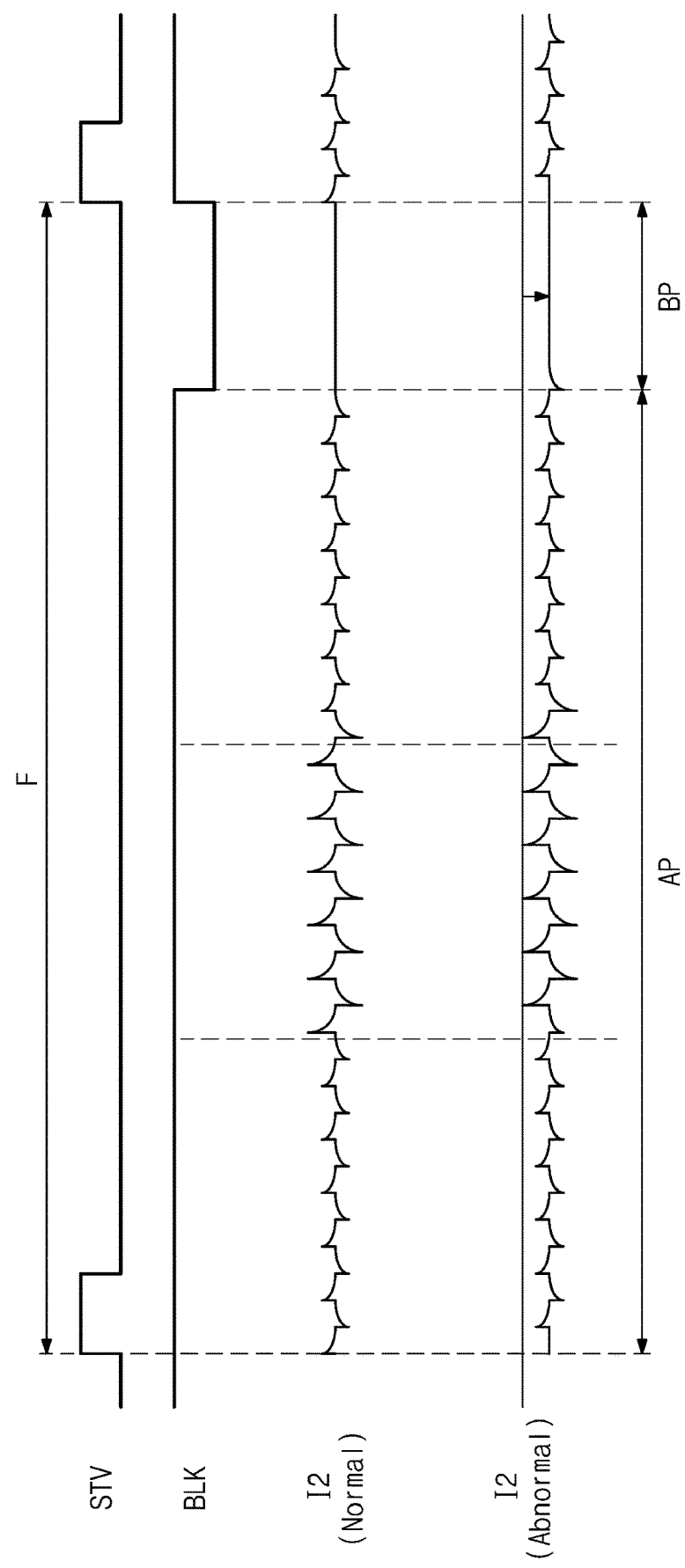

FIG. 3 is a view showing a normal state of a current flowing through a voltage terminal of a voltage generation circuit, which outputs the ground voltage, and an abnormal state caused by an over-current.

Referring to FIGS. 1 to 3, in an exemplary embodiment, the voltage generation circuit 124 may stop generating the driving voltages when it is detected that the over-current flows through at least one voltage terminal among the voltage terminals during the blank period BP in which the blank signal BLK is in the active state. In one exemplary embodiment, for example, the gate-on voltage VON and the ground voltage VSS generated by the voltage generation circuit 124 may be applied to the gate driver 122. Since the gate driver 122 drives the gate lines GL1 to GLn during the active period within one frame F, a predetermined current I1 flows through the voltage terminal, from which the gate-on voltage VON generated by the voltage generation circuit 124 is output, and a predetermined current I2 flows through the voltage terminal from which the ground voltage VSS generated by the voltage generation circuit 124 is output.

Since the gate driver 122 does not drive the gate lines GL1 to GLn during the blank period BP within the one frame F, the current I1 flowing through the voltage terminal that outputs the gate-on voltage VON generated by the voltage generation circuit 124 is approximated to zero (0), that is, decreased to be about zero (0), during the blank period BP, and the current I2 flowing through the voltage terminal that outputs the ground voltage VS S generated by the voltage generation circuit 124 is approximated to zero (0) during the blank period BP.

When the current I1 flows through the voltage terminal that outputs the gate-on voltage VON from the voltage generation circuit 124 during the blank period BP, and the current I2 flows through the voltage terminal that outputs the ground voltage VSS from the voltage generation circuit 124 during the blank period BP, due to various reasons, e.g., a signal line for the gate-on voltage is shorted to a signal line for the ground voltage VSS in the gate driver 122, the voltage generation circuit 124 recognizes the state is as an abnormal state. When the abnormal state in which the over-current flows is detected, the voltage generation circuit 124 may stop generating the driving voltages.

During the active period AP of one frame F, an amount of the current flowing through the voltage terminals of the voltage generation circuit 124 may be changed to various levels. In addition, an amount of a leakage current or an amount of short-circuit current may be varied depending on a length of a signal line that transfers the driving voltage.

In an exemplary embodiment, the voltage generation circuit 124 may detect the variation in current flowing through the voltage terminal that outputs the driving voltage during the blank period BP, and thus a reliability of detecting the over-current may be improved.

Figure 4:
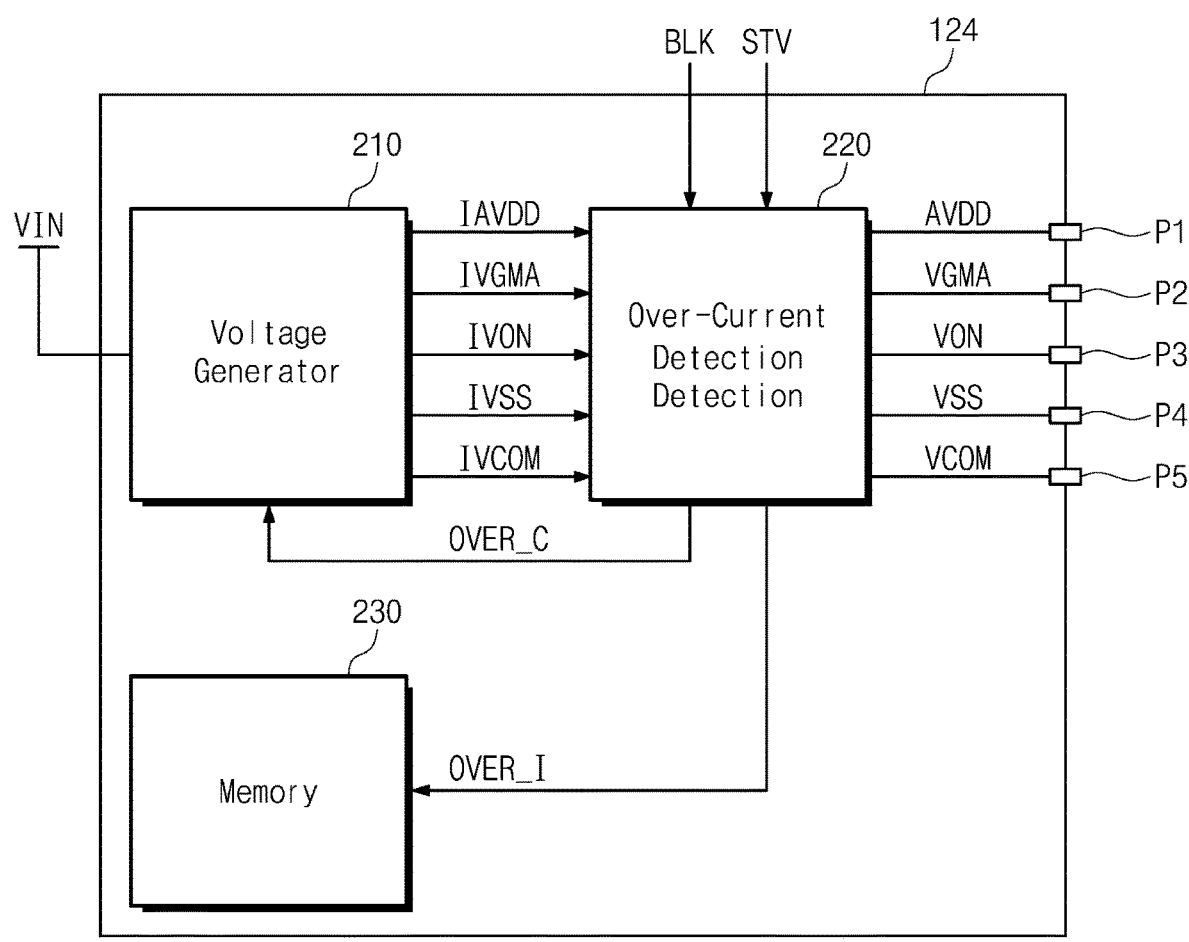
FIG. 4 is a block diagram showing a voltage generation circuit according to an exemplary embodiment of the disclosure.

FIG. 4 is a block diagram showing a voltage generation circuit according to an exemplary embodiment of the disclosure.

Referring to FIG. 4, an exemplary embodiment of the voltage generation circuit 124 includes voltage terminals P1 to P5, a voltage generator 210, and an over-current detection circuit 220. The voltage generator 210 receives the power voltage VIN and generates internal driving voltages, e.g., an internal analog power voltage IAVDD, an internal gamma voltage IVGMA, an internal gate-on voltage IVON, an internal ground voltage IVSS and an internal common voltage IVCOM.

The over-current detection circuit 220 converts the internal driving voltages (e.g., the internal analog power voltage IAVDD, the internal gamma voltage IVGMA, the internal gate-on voltage IVON, the internal ground voltage IVSS and the internal common voltage IVCOM) to the driving voltages (e.g., the analog power voltage AVDD, the gamma voltage VGMA, the gate-on voltage VON, the ground voltage VSS and the common voltage VCOM), provides the driving voltages (e.g., the analog power voltage AVDD, the gamma voltage VGMA, the gate-on voltage VON, the ground voltage VSS and the common voltage VCOM) to the voltage terminals P1 to P5, respectively, detects output currents respectively flowing through the voltage terminals P1 to P5 during the blank period in which the blank signal BLK is activated, and outputs an over-current detection signal OVER_C. When it is determined or detected that the over-current flows through at least one of the voltage terminals P1 to P5, the over-current detection circuit 220 may activate the over-current detection signal OVER_C.

When the over-current detection signal OVER_C is activated, the voltage generator 210 may stop generating the internal driving voltages. When the over-current flows through at least one of the voltage terminals P1 to P5, the voltage generator 210 stops generating the driving voltages (e.g., the analog power voltage AVDD, the gamma voltage VGMA, the gate-on voltage VON, the ground voltage VSS and the common voltage VCOM), which are output to the voltage terminals P1 to P5, respectively, and thus a malfunction of the display panel 110 shown in FIG. 1 and a fire caused by the malfunction may be effectively prevented from occurring.

The voltage generation circuit 124 may further include a memory 230. The memory 230 may be a non-volatile memory, such as a hard drive, an optical memory, an NAND memory, a flash memory or the like.

When it is determined that the over-current flows through at least one terminal among the voltage terminals P1 to P5, the over-current detection circuit 220 may output an over-current information signal OVER_I. The over-current information signal OVER_I may include information about the voltage terminal through which the over-current flows among the voltage terminals P1 to P5.

The memory 230 stores the over-current information signal OVER_I from the over-current detection circuit 220. A user may investigate a cause of errors in the voltage generation circuit 124 on the basis of the over-current information signal OVER_I.

Figure 5:
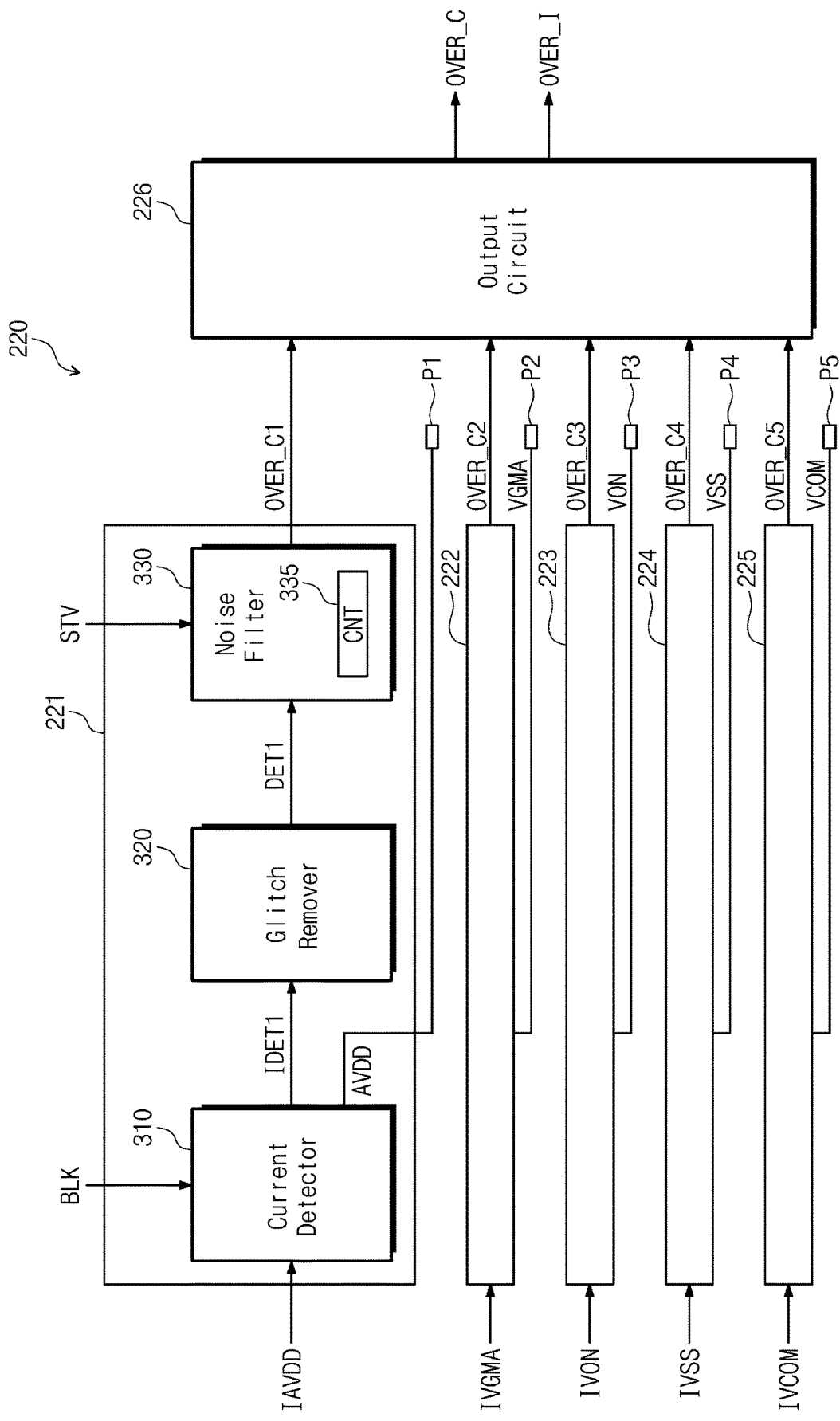
FIG. 5 is a block diagram showing an exemplary embodiment of an over-current detection circuit shown in FIG. 4.

FIG. 5 is a block diagram showing an exemplary embodiment of the over-current detection circuit 220 shown in FIG. 4.

Referring to FIG. 5, an exemplary embodiment of the over-current detection circuit 220 includes current detection circuits 221 to 225 corresponding to the voltage terminals P1 to P5, respectively, and an output circuit 226. In such an embodiment, as shown in FIG. 5, the number of the voltage terminals P1 to P5 may be 5 and the number of the current detection circuits 221 to 225 may be 5, but the number of the voltage terminals and the number of the current detection circuits are not be limited thereto or thereby. The current detection circuit 221 receives the internal analog power voltage IAVDD of the internal driving voltages, outputs the analog power voltage AVDD to a voltage terminal P1, and outputs a first over-current detection signal OVER_C1. The current detection circuit 222 receives the internal gamma voltage IVGMA of the internal driving voltages, outputs the gamma voltage VGMA to a voltage terminal P2, and outputs a second over-current detection signal OVER_C2. The current detection circuit 223 receives the internal gate-on voltage IVON of the internal driving voltages, outputs the gate-on voltage VON to a voltage terminal P3, and outputs a third over-current detection signal OVER_C3. The current detection circuit 224 receives the internal ground voltage IVSS of the internal driving voltages, outputs the ground voltage VSS to a voltage terminal P4, and outputs a fourth over-current detection signal OVER_C4. The current detection circuit 225 receives the internal common voltage IVCOM of the internal driving voltages, outputs the common voltage VCOM to a voltage terminal P5, and outputs a fifth over-current detection signal OVER_C5.

In such an embodiment, the current detection circuit 221 includes a current detector 310, a glitch remover 320, and a noise filter 330. The current detection circuits 222 to 225 have the same circuit configuration and function as those of the current detection circuit 221, and any repetitive detailed description thereof will be omitted.

The current detector 310 converts the internal driving voltage IAVDD, IVGMA, IVON, IVSS or IVCOM to the driving voltage AVDD, VGMA, VON, VSS or VCOM, provides the driving voltage AVDD, VGMA, VON, VSS or VCOM to a corresponding voltage terminal of the voltage terminals P1 to P5, and outputs a detection signal IDET1 at a first level when a voltage corresponding to the output current flowing through the corresponding voltage terminal during the blank period in which the blank signal BLK is activated is lower than a first reference level or higher than a second reference level. The glitch remover 320 outputs a noise detection signal DET1 when the detection signal IDET1 is maintained at the first level during a time longer than a predetermined time period, e.g., a reference maintenance time period. The noise filter 330 activates the first over-current detection signal OVER_C1 when the noise detection signal DET1 is activated multiple times during a predetermined time period. The noise filter 330 may include a counter 335 (CNT in FIG. 5).

The output circuit 226 activates the over-current detection signal OVER_C when at least one of the first to fifth over-current detection signals OVER_C1 to OVER_C5 from the over-current detection circuits 221 to 225 is activated. The output circuit 226 outputs the over-current information signal OVER_I corresponding to the activated signal among the first to fifth over-current detection signals OVER_C1 to OVER_C5.

The operation and the circuit configuration of the current detector 310, the glitch remover 320, and the noise filter 330 of the current detection circuit 221 will be described later in greater detail.

Figure 6:
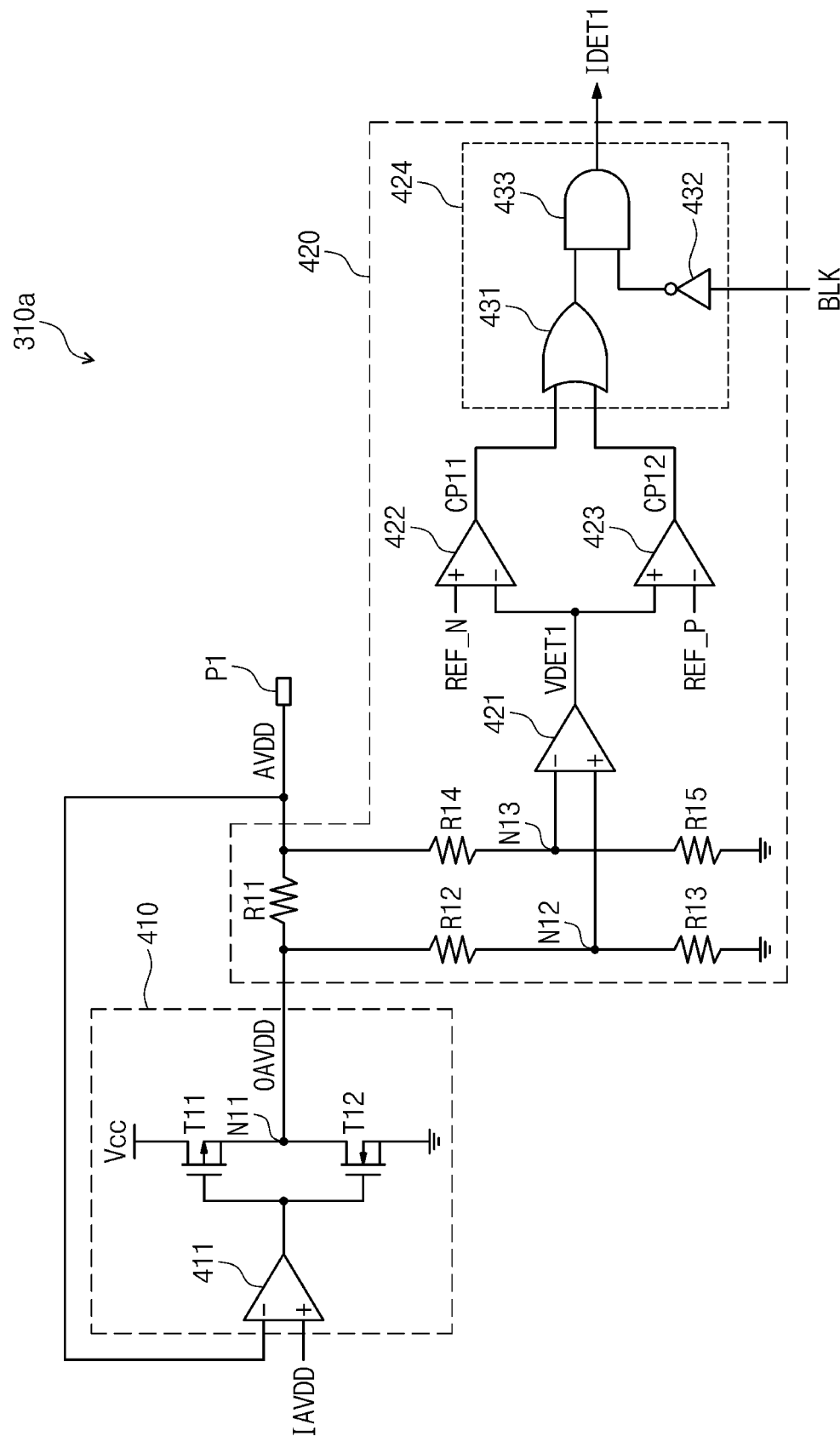
FIG. 6 is a circuit diagram showing a circuit configuration of a current detector shown in FIG. 5 according to an exemplary embodiment of the disclosure.

FIG. 6 is a circuit diagram showing a circuit configuration of a current detector 310a shown in FIG. 5 according to an exemplary embodiment of the disclosure. Referring to FIG. 6, an exemplary embodiment of the current detector 310a includes a voltage output circuit 410 and a protection circuit 420. The voltage output circuit 410 converts the internal driving voltage (i.e., the internal analog power voltage IAVDD) to a constant level driving voltage (i.e., the analog power voltage AVDD) and outputs the constant level driving voltage to the corresponding voltage terminal, e.g., the voltage terminal P1. The voltage output circuit 410 includes a comparator 411, a first output transistor T11 and a second output transistor T12. The comparator 411 compares the internal analog power voltage IAVDD and the analog power voltage AVDD, and outputs a voltage corresponding to a comparison result thereof to an output terminal thereof (no reference number in FIG. 6). The first output transistor T11 includes a first electrode connected to a power voltage Vcc, a second electrode connected to an output node N11, and a gate electrode connected to the output terminal of the comparator 411. The second output transistor T12 includes a first electrode connected to the output node N11, a second electrode connected to a ground terminal (no reference number in FIG. 6), and a gate electrode connected to the output terminal of the comparator 411. In an exemplary embodiment, the first output transistor T11 is a P-type metal-oxide-semiconductor ("PMOS") transistor, and the second output transistor T12 is an N-type metal-oxide-semiconductor ("NMOS") transistor. One of the first output transistor T11 and the second output transistor T12 is turned on depending on the comparison result of the comparator 411, that is, a result of comparing the internal analog power voltage IAVDD and the analog power voltage AVDD by the comparator 411, and thus a constant level output analog power voltage OAVDD may be output to the output node N11.

The protection circuit 420 is connected between the output node N11 and the voltage terminal P1. The protection circuit 420 outputs the detection signal IDET1 at the first level (e.g., the high level) when the voltage corresponding to the output current of the voltage terminal P1 is less than the first reference level REF_N or higher than the second reference level REF_P during the blank period in which the blank signal BLK is in the active state (e.g., the low level).

The protection circuit 420 includes resistors R11, R12, R13, R14 and R15, first to third comparators 421, 422 and 423, and a logic circuit 424. The resistor R11 is connected between the output node N11 and the voltage terminal P1. The resistor R12 is connected between the output node N11 and a first node N12. The resistor R13 is connected between the first node N12 and the ground terminal. The resistor R14 is connected between the voltage terminal P1 and a second node N13. The resistor R15 is connected between the second node N13 and the ground terminal.

The first comparator 421 compares a voltage of the first node N12 to a voltage of the second node N13, and outputs a detection voltage VDET1 corresponding to a comparison result thereof. The second comparator 422 compares the first reference level REF_N with the detection voltage VDET1, and outputs a first comparison signal CP11. The third comparator 423 compares the second reference level REF_P with the detection voltage VDET1, and outputs a second comparison signal CP12. In one exemplary embodiment, for example, the first reference level REF_N is a lower limit reference value, and the second reference level REF_P is an upper limit reference value. When the detection voltage VDET1 is lower than the lower limit reference value (i.e., the first reference level REF_N), the first comparison signal CP11 having the first level (e.g., the high level) is output to the logic circuit 424. When the detection voltage VDET1 is higher than the upper limit reference value (i.e., the second reference level REF_P), the second comparison signal CP12 having the first level (e.g., the high level) is output to the logic circuit 424.

The logic circuit 424 includes an OR gate 431, an inverter 432 and an AND gate 433. The OR gate 431 outputs a signal at a high level when at least one of the first comparison signal CP11 and the second comparison signal CP12 transmitted thereto has the first level (e.g., the high level). The inverter 432 outputs the blank signal BLK after inverting the blank signal BLK. In an exemplary embodiment, where the blank signal BLK is activated at the second level (e.g., the low level) during the blank period, the logic circuit 424 includes the inverter 432. However, in an exemplary embodiment, where the blank signal BLK is activated at the first level (e.g., the high level) during the blank period, the logic circuit 424 may not include the inverter 432.

In an exemplary embodiment, the source driver 123 shown in FIG. 1 does not drive the data lines DL1 to DLm during the blank period, in which the blank signal BLK is activated at the second level (e.g., the low level), i.e., the data lines DL1 to DLm are inactivated, the current flowing through the voltage terminal P1 that outputs the analog power voltage AVDD is approximated to zero (0). In such an embodiment, the current flowing through the voltage terminal P1 during the blank period in the normal state is about zero (0). In such an embodiment, when the current flows through the voltage terminal P1 during the blank period due to the short between the signal lines (i.e., an over-current state), a voltage difference occurs between both ends of the resistor R11, i.e., between the output node N11 and the voltage terminal P1. The voltage difference between the output node N11 and the voltage terminal P1 is substantially proportional to the current flowing through the voltage terminal P1.

When a voltage difference between the first node N12 and the second node N13, which corresponds to the voltage difference between the output node N11 and the voltage terminal P1 is lower than the first reference level REF_N, the first comparison signal CP11 has the first level, and when the voltage difference between the first node N12 and the second node N13, which corresponds to the voltage difference between the output node N11 and the voltage terminal P1 is higher than the second reference level REF_P, the second comparison signal CP12 has the first level.

The logic circuit 424 outputs the detection signal IDET1 at the first level when at least one of the first comparison signal CP11 and the second comparison signal CP12 has the first level.

Figure 7:
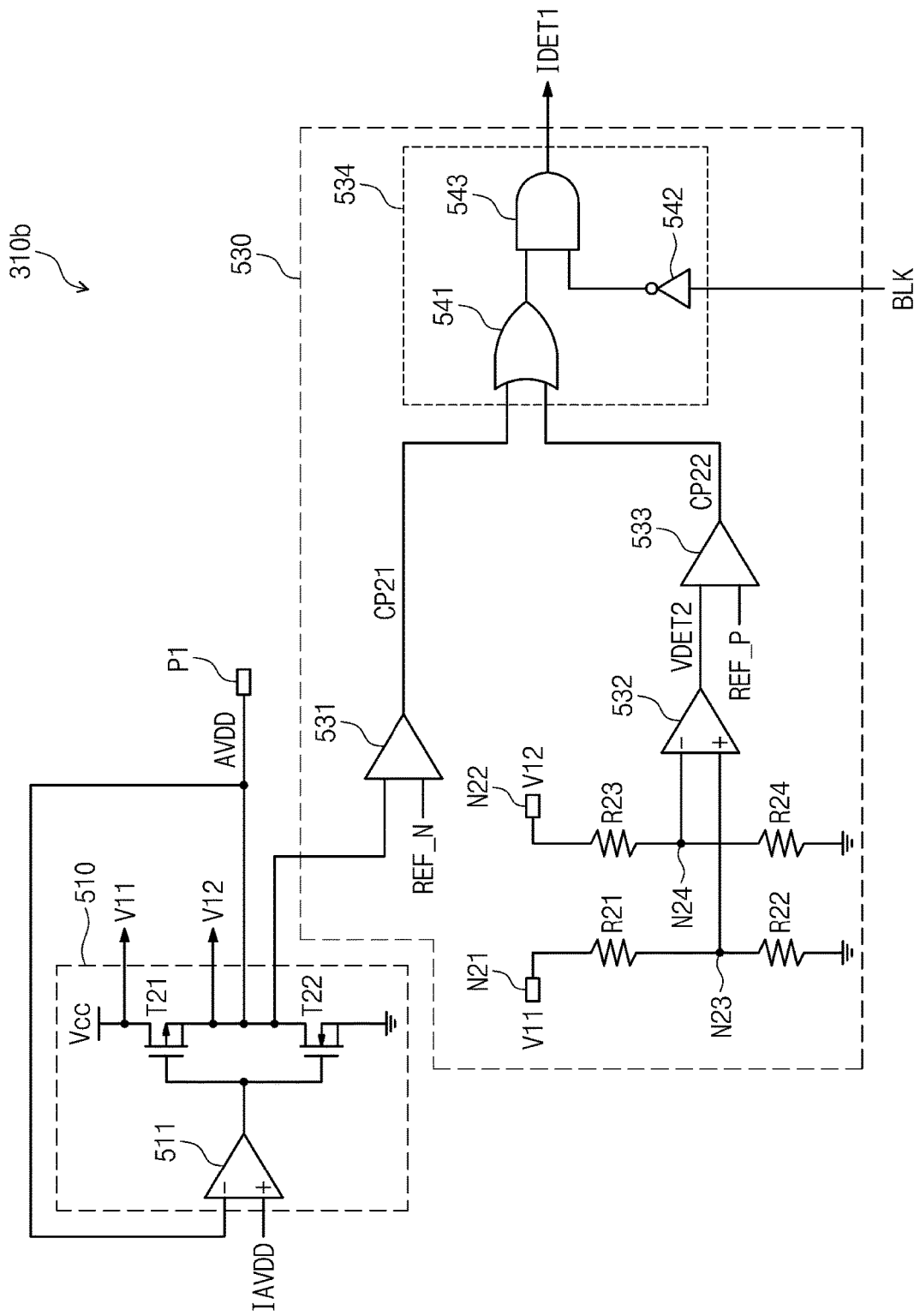
FIG. 7 is a circuit diagram showing a circuit configuration of a current detector shown in FIG. 5 according to an alternative embodiment of the disclosure.

FIG. 7 is a circuit diagram showing a circuit configuration of a current detector 310b shown in FIG. 5 according to an alternative exemplary embodiment of the disclosure.

Referring to FIG. 7, the current detector 310b includes a voltage output circuit 510 and a protection circuit 530. The voltage output circuit 510 includes a comparator 511, a first output transistor T21, and a second output transistor T22. The voltage output circuit 510 has substantially the same circuit configuration as that of the voltage output circuit 410 described above with reference to FIG. 6, and thus any repetitive detailed description thereof will be omitted.

The protection circuit 530 includes resistors R21, R22, R23 and R24, a first comparator 531, a second comparator 532, a third comparator 533, and a logic circuit 534. The resistor R21 is connected between a first node N21, to which a voltage of a first electrode of the first output transistor T21, i.e., a first detection voltage V11, is applied, and a third node N23. The resistor R22 is connected between the third node N23 and a ground terminal. The resistor R23 is connected between a second node N22, to which a voltage of a second electrode of the first output transistor T21, i.e., a second detection voltage V12, is applied, and a fourth node N24. The resistor R24 is connected between the fourth node N24 and the ground terminal. The second node N22 is commonly connected to the second electrode of the first output transistor T21, the first electrode of the second output transistor T22, and the voltage terminal P1.

The first comparator 531 compares the analog power voltage AVDD, which is output to the voltage terminal P1, and the first reference level REF_N to output a first comparison signal CP21.

The second comparator 532 compares a voltage of the third node N23 and a voltage of the fourth node N24 to output a detection voltage VDET2 corresponding to a comparison result thereof.

The third comparator 533 compares the detection voltage VDET2 and the second reference level REF_P to output a second comparison signal CP22 corresponding to a comparison result thereof.

The logic circuit 534 includes an OR gate 541, an inverter 542, and an AND gate 543. The logic circuit 534 has the similar circuit configuration and function as those of the logic circuit 424 shown in FIG. 6, and thus any repetitive detailed description thereof will be omitted.

In an exemplary embodiment, the first output transistor T21 is a PMOS transistor, and the second output transistor T22 is an NMOS transistor. Each of the first output transistor T21 and the second output transistor T22 has an internal resistance.

In such an embodiment, as described above, the current flowing through the voltage terminal P1 during the blank period in the normal state is about zero (0). When the current flows through the voltage terminal P1 during the blank period due to the short between the signal lines, a voltage difference occurs between the first electrode (i.e., the first node N21) of the first output transistor T21 and the second electrode (i.e., the second node N22) of the first output transistor T21. The second comparison signal CP22 has the first level when the voltage difference between the third node N23 and the fourth node N24, which corresponds to the voltage difference between the first node N21 and the second node N22, is higher than the second reference level REF_P.

When the current flows through the voltage terminal P1 during the blank period, a voltage difference occurs between the first electrode (i.e., the voltage terminal P1) of the second output transistor T22 and the second electrode (i.e., the ground terminal) of the second output transistor T22. The first comparison signal CP21 has the first level when the voltage (i.e., the analog power voltage AVDD) of the voltage terminal P1 is lower than the first reference level REF_N.

The logic circuit 534 outputs the detection signal IDET1 at the first level when at least one of the first comparison signal CP11 and the second comparison signal CP12 has the first level.

Figure 8:
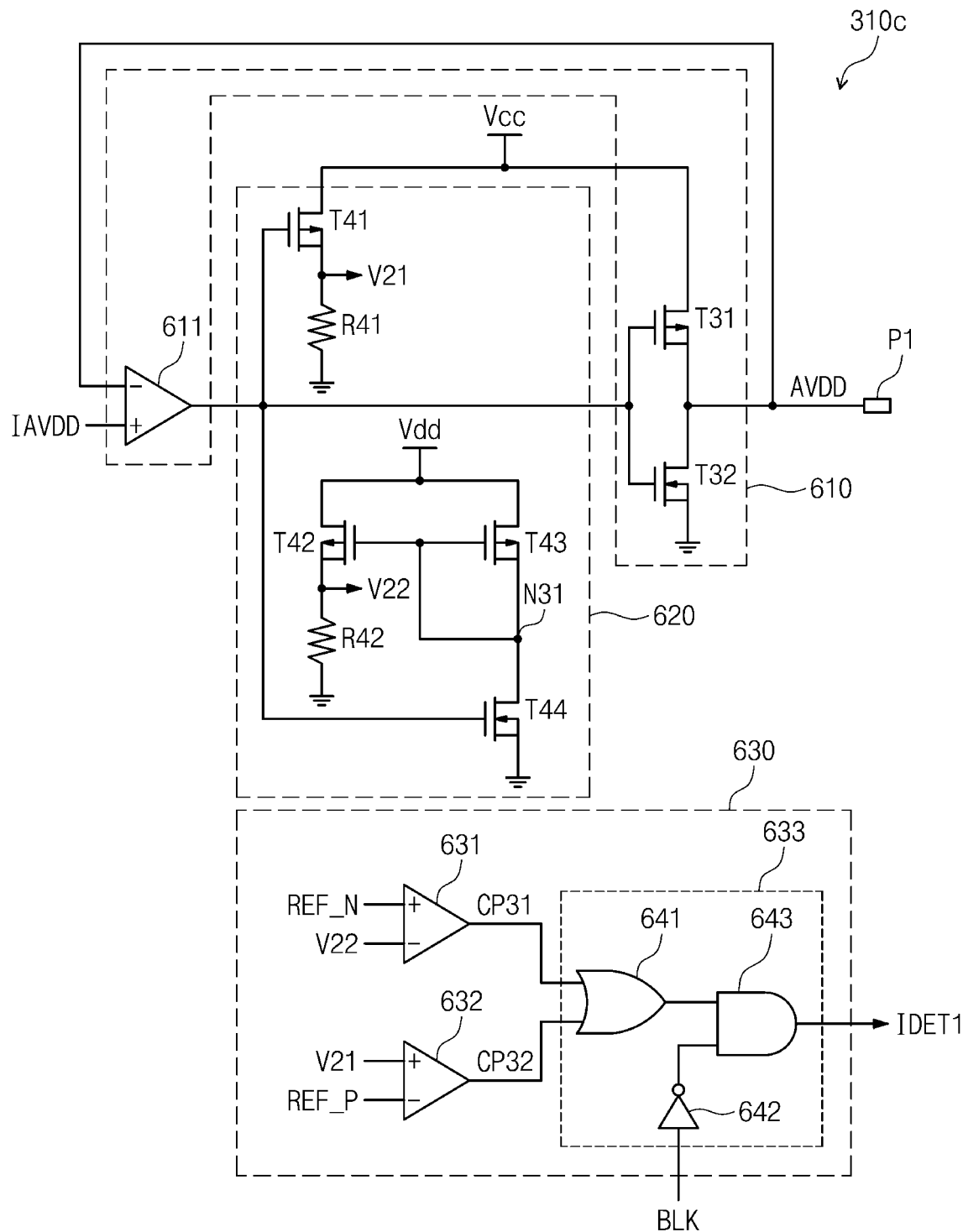
FIG. 8 is a circuit diagram showing a circuit configuration of a current detector shown in FIG. 5 according to another alternative embodiment of the disclosure.

FIG. 8 is a circuit diagram showing a circuit configuration of a current detector 310c shown in FIG. 5 according to another alternative exemplary embodiment of the disclosure.

Referring to FIG. 8, in an exemplary embodiment, the current detector 310c includes a voltage output circuit 610, a detection circuit 620, and a protection circuit 630. The voltage output circuit 610 converts the internal driving voltage (i.e., the internal analog power voltage IAVDD) to a constant level driving voltage (i.e., the analog power voltage AVDD), and outputs the constant level driving voltage to the voltage terminal P1. The voltage output circuit 610 includes a comparator 611, a first output transistor T31 and a second output transistor T32. The comparator 611 compares the internal analog power voltage IAVDD and the analog power voltage AVDD, and outputs a voltage corresponding to a comparison result thereof to an output terminal (no reference number in FIG. 8). The first output transistor T31 includes a first electrode connected to a power voltage Vcc, a second electrode connected to the voltage terminal P1, and a gate electrode connected to the output terminal of the comparator 611. The second output transistor T32 includes a first electrode connected to the voltage terminal P1, a second electrode connected to a ground terminal (no reference number in FIG. 8), and a gate electrode connected to the output terminal of the comparator 611. In an exemplary embodiment, the first output transistor T31 is a PMOS transistor, and the second output transistor T32 is an NMOS transistor. One of the first output transistor T31 and the second output transistor T32 is turned on depending on the comparison result of the comparator 611, that is a result of comparing the internal analog power voltage IAVDD and the analog power voltage AVDD by the comparator 611, and thus an analog power voltage AVDD at the constant level may be output to the voltage terminal P1.

In an exemplary embodiment, a first mirror transistor T41 has a channel length less than that of the first output transistor T31. According to an alternative exemplary embodiment, the first mirror transistor T41 may have a same channel length as the first output transistor T31.

In an exemplary embodiment, each of second to fourth mirror transistors T42 and T44 has a channel length less than that of the second output transistor T32. According to an alternative exemplary embodiment, each of second to fourth mirror transistors T42 and T44 may have a same channel length as the second output transistor T32.

The detection circuit 620 includes the first to fourth mirror transistors T41 to T44 and resistors R41 and R42. The first mirror transistor T41 includes a first electrode that receives a power voltage Vdd, a second electrode, and a gate electrode that receives the voltage output from the comparator 611. The resistor R41 is connected between the second electrode of the first mirror transistor T41 and the ground terminal. The second mirror transistor T42 includes a first electrode that receives the power voltage Vdd, a second electrode, and a gate electrode connected to the second electrode. In an exemplary embodiment, the power voltage Vcc and the power voltage Vdd may be the same as or different from each other. The resistor R42 is connected between the second electrode of the second mirror transistor T42 and the ground terminal. The third mirror transistor T43 includes a first electrode that receives the power voltage Vdd, a second electrode connected to a first node N31, and a gate electrode connected to the gate electrode of the second mirror transistor T42. The fourth mirror transistor T44 includes a first electrode connected to the first node N31, a second electrode connected to the ground terminal, and a gate electrode connected to the output terminal of the comparator 611. A voltage of the second electrode of the first mirror transistor T41 is output as a first detection voltage V21, and a voltage of the second electrode of the second mirror transistor T42 is output as a second detection voltage V22.

The protection circuit 630 outputs the detection signal IDET1 at the first level when the voltage level of the first detection voltage V21 is higher than the second reference level or the voltage level of the second detection voltage V22 is lower than the first reference level, during the blank period in which the blank signal BLK is in the active state (e.g., the low level).

The protection circuit 630 includes a first comparator 631, a second comparator 632, and a logic circuit 633. The first comparator 631 compares the second detection voltage V22 with the first reference level REF_N, and outputs a first comparison signal CP31. The second comparator 632 compares the second reference level REF_P with the first detection voltage V21, and outputs a second comparison signal CP32. In one exemplary embodiment, for example, the first reference level REF_N is a lower limit reference value, and the second reference level REF_P is an upper limit reference value. When the second detection voltage V22 is lower than the lower limit reference value (i.e., the first reference level REF_N), the first comparison signal CP31 having the first level (e.g., the high level) is output to the logic circuit 633. When the first detection voltage V21 is higher than the upper limit reference value (i.e., the second reference level REF_P), the second comparison signal CP32 having the first level (e.g., the high level) is output to the logic circuit 63.

The logic circuit 633 includes an OR gate 641, an inverter 642, and an AND gate 643. The OR gate 641 outputs a high level signal when at least one of the first comparison signal CP31 and the second comparison signal CP32 transmitted thereto has the first level (e.g., the high level). The inverter 642 inverts and outputs the blank signal BLK. In an exemplary embodiment, where the blank signal BLK is activated at the second level (e.g., the low level) during the blank period, the logic circuit 633 includes the inverter 642. However, in a case that the blank signal BLK is activated at the first level (e.g., the high level) during the blank period, the logic circuit 633 may not include the inverter 642.

Since the source driver 123 shown in FIG. 1 does not drive the data lines DL1 to DLm during the blank period in which the blank signal BLK is activated at the second level (e.g., the low level) i.e., the data lines DL1 to DLm are inactivated, the current flowing through the voltage terminal P1 that outputs the analog power voltage AVDD is approximated to zero (0). In such an embodiment, the current flowing through the voltage terminal P1 during the blank period in the normal state is about zero (0). When the current flows through the voltage terminal P1 during the blank period due to the short between the signal lines (i.e., an over-current state) while a signal at the low level is output to the output terminal of the comparator 611 during the blank period, the current flows between the first electrode and the second electrode of the first output transistor T31, and the current flows between the first electrode and the second electrode of the first mirror transistor T41. In such an embodiment, when the current flows through the voltage terminal P1 (i.e., an over-current state) while a signal at the high level is output to the output terminal of the comparator 611 during the blank period, the current flows between the first electrode and the second electrode of the second output transistor T32, and the current flows between the first electrode and the second electrode of the first mirror transistor T41. In such an embodiment, the detection circuit 620 may output one of the first detection voltage V21 and the second detection voltage V22, which corresponds to the current flowing through the voltage terminal P1.

Figure 9:
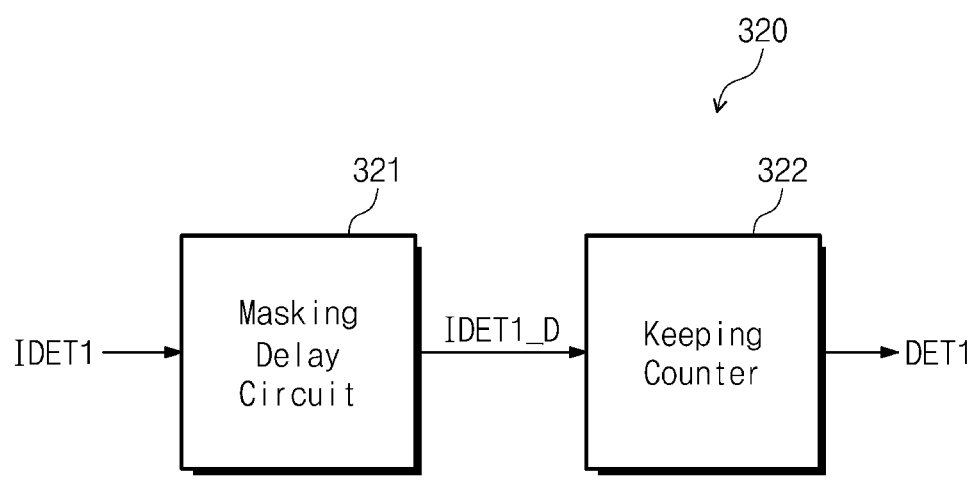
FIG. 9 is a block diagram showing a glitch remover according to an exemplary embodiment of the disclosure.
Figure 10:
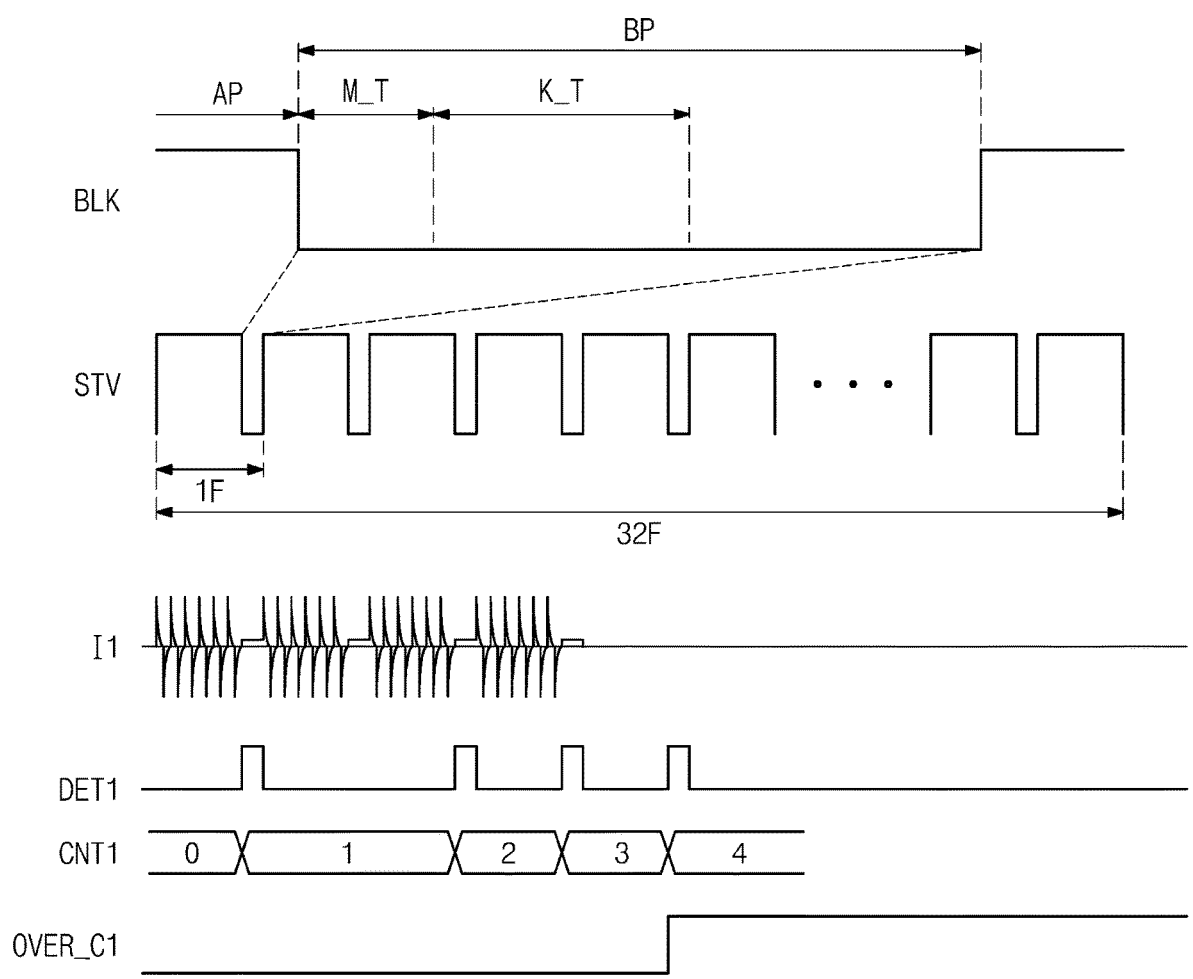
FIG. 10 is a signal timing diagram showing signals depending on an over-current detection operation of a voltage generation circuit according to an exemplary embodiment of the disclosure.

FIG. 9 is a block diagram showing a configuration of the glitch remover 320 shown in FIG. 5 according to an exemplary embodiment of the disclosure. FIG. 10 is a signal timing diagram showing signals depending on an over-current detection operation of a voltage generation circuit according to an exemplary embodiment of the disclosure.

Referring to FIGS. 9 and 10, an exemplary embodiment of the glitch remover 320 includes a masking delay circuit 321 and a keeping counter 322. The masking delay circuit 321 receives the detection signal IDET1 output from the current detector 310 shown in FIG. 5 and outputs a delayed detection signal IDET1_D after a masking delay time M_T elapses.

The current flowing through the voltage terminal P1 may be maintained at a stable level after the predetermined time elapses when an active period AP is changed to the blank period BP in one frame F. The masking delay circuit 321 does not output the delayed detection signal IDET1_D until a predetermined masking delay time M_T (e.g., about 50 μs) elapses after the detection signal IDET1 having the first level (e.g., the high level) is output. The masking delay circuit 321 outputs the detection signal IDET1 received after the predetermined masking delay time M_T elapses as the delayed detection signal IDET1_D.

In such an embodiment, a noise component when the active period AP is changed to the blank period BP may be effectively distinct from the over-current may be effectively distinct from.

The keeping counter 322 performs a count-up operation during a period, in which the delayed detection signal IDET1_D has the first level, and outputs the noise detection signal DET1 when the counted value corresponds to a keeping time K_T.

Figure 11:
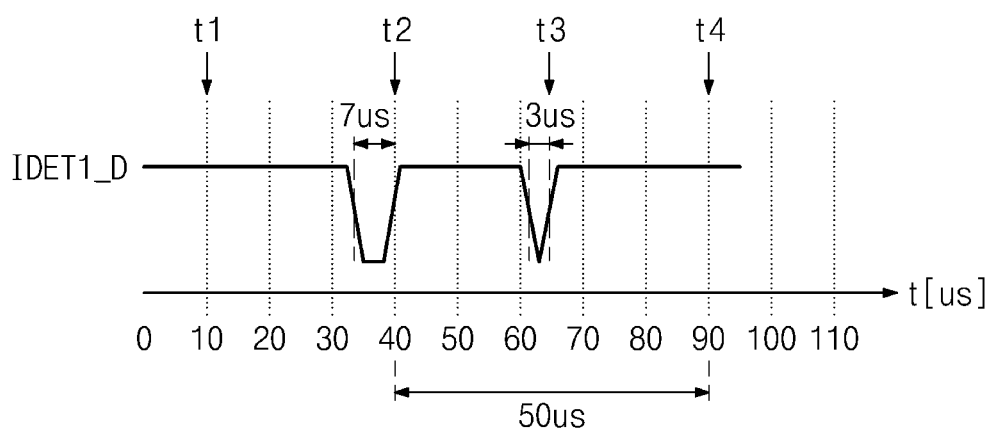
FIG. 11 is a waveform diagram showing a delayed current detection signal to explain a glitch removing operation according to an exemplary embodiment of the disclosure.

FIG. 11 is a waveform diagram showing the delayed detection signal to explain a glitch removing operation of the keeping counter 322 shown in FIG. 9 according to an exemplary embodiment of the disclosure.

Referring to FIGS. 9, 10 and 11, when a current I1 flowing to the voltage terminal P1 during the blank period BP is temporarily changed, the delayed detection signal IDET_D may be changed depending on the change of the current I1.

The keeping counter 322 performs the count-up operation during the period, in which the delayed detection signal IDET_D has the first level, and maintains the count-up operation without resetting the counted value when a time period, during which the delayed detection signal IDET_D is maintained at the second level (e.g., the low level), is within (e.g. less than) a predetermined time period (e.g., about 5 microseconds (μs)).

In such an embodiment, as shown in FIG. 11, when the time period during which the delayed detection signal IDET_D is maintained at the second level (e.g., the low level) is about 7 μs that is longer than the predetermined time period (e.g., about 5 μs), the keeping counter 322 resets the counted value.

In one exemplary embodiment, for example, the keeping counter 322 starts the count-up operation at a time point t1 at which the delayed detection signal IDET_D having the first level (e.g., the high level) is output from the second level (e.g., the low level). The keeping counter 322 resets the counted value at a time point t2 at which it is determined that the time period during which the delayed detection signal IDET_D is maintained at the second level (e.g., the low level) is longer than the predetermined time period (e.g., about 5 μs). In such an embodiment, since the delayed detection signal IDET_D having the high level is repeatedly output, the keeping counter 322 starts the count-up operation. When it is determined that the time period, during which the delayed detection signal IDET_D is maintained at the second level, is shorter than the predetermined time period (e.g., about 5 µs) at a time point t3, the keeping counter 322 maintains the count-up operation.

When the counted value reaches a predetermined value (e.g., a value corresponding to about 50 µs) at a time point t4, the keeping counter 322 activates the noise detection signal DET1 to the first level (e.g., the high level).

Referring to FIGS. 5 and 9, the noise filter 330 counts up the counted value CNT1 of the counter 335 when the vertical start signal STV is activated and the noise detection signal DET1 is activated to the first level. When the counted value CNT1 of the counter 335 reaches a predetermined value (e.g., 4) within a predetermined time (e.g., 32 frames), the noise filter 330 activates the first over-current detection signal OVER_C1 to the first level.

In an exemplary embodiment, the noise filter 330 may activate the first over-current detection signal OVER_C1 to the first level when the number of frames in which it is determined that the over-current flows among the 32 frames is equal to or greater than 4.

The current detector 310 may check whether the over-current flows through the voltage terminal P1 during the blank period by using the embodiments shown in FIGS. 6 to 8. The glitch remover 320 and the noise filter 330 may check whether the over-current state checked by the current detector 310 is temporary due to the noise component.

According to embodiments of the disclosure, since the over-current is detected during the blank period of the display device, the reliability of detecting the over-current may be improved regardless of the position of the shorted lines and the size of the display panel. In such embodiments, the glitch removing operation and the noise filtering operation are performed on the over-current detection signal, and thus the over-current protection function may be effectively prevented from malfunctioning.

The invention should not be construed as being limited to the exemplary embodiments set forth herein. Rather, these exemplary embodiments are provided so that this disclosure will be thorough and complete and will fully convey the concept of the present invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A voltage generation circuit comprising:
a voltage terminal which outputs a driving voltage;
a voltage generator which generates an internal driving voltage; and
an over-current detection circuit which converts the internal driving voltage to the driving voltage to provide the driving voltage to the voltage terminal and outputs an over-current detection signal,
wherein the over-current detection circuit comprises:
a current detector which converts the internal driving voltage to the driving voltage to provide the driving voltage to the voltage terminal, and outputs a detection signal at a first level when a voltage corresponding to an output current flowing through the voltage terminal during a blank period, in which a blank signal is activated, is lower than a first reference level or higher than a second reference level;
a glitch remover which outputs a noise detection signal when a time period, during which the detection signal is maintained at the first level, is longer than a reference maintenance time period; and
a noise filter which activates the over-current detection signal when the noise detection signal is activated at least twice during a predetermined time period.

2. The voltage generation circuit of claim 1, wherein the current detector comprises:
a voltage output circuit which converts the internal driving voltage to the driving voltage at a constant level to provide the driving voltage at the constant level to the voltage terminal;
a detection circuit which outputs a first detection voltage and a second detection voltage corresponding to the output current; and
a protection circuit which outputs the detection signal at the first level when a voltage level of the first detection voltage is lower than the first reference level or when a voltage level of the second detection voltage is higher than the second reference level.

3. The voltage generation circuit of claim 2, wherein the voltage output circuit comprises:
a comparator which compares the internal driving voltage and the driving voltage, and outputs an output voltage corresponding to a comparison result thereof through an output terminal thereof;
a first output transistor comprising a first electrode which receives a first power voltage, a second electrode connected to the voltage terminal, and a gate electrode connected to the output terminal of the comparator; and
a second output transistor comprising a first electrode connected to the voltage terminal, a second electrode connected to a ground terminal, and a gate electrode connected to the output terminal of the comparator.

4. The voltage generation circuit of claim 3, wherein the detection circuit comprises:
a first mirror transistor comprising a first electrode which receives a second power voltage, a second electrode, and a gate electrode which receives the output voltage;
a first resistor connected between the second electrode of the first mirror transistor and the ground terminal;
a second mirror transistor comprising a first electrode which receives the second power voltage, a second electrode, and a gate electrode connected to the second electrode;
a second resistor connected between the second electrode of the second mirror transistor and the ground terminal;
a third mirror transistor comprising a first electrode which receives the second power voltage, a second electrode connected to a first node, and a gate electrode connected to the gate electrode of the second mirror transistor; and
a fourth mirror transistor comprising a first electrode connected to the first node, a second electrode connected to the ground terminal, and a gate electrode connected to the output terminal of the comparator,
wherein a voltage of the second electrode of the first mirror transistor is the first detection voltage, and a voltage of the second electrode of the second mirror transistor is the second detection voltage.

5. The voltage generation circuit of claim 4, wherein the first mirror transistor has a channel length less than a channel length of the first output transistor.

6. The voltage generation circuit of claim 2, wherein the protection circuit comprises:
- a first comparator which compares the first detection voltage and the first reference level, and outputs a first comparison signal based on a comparison result thereof;
- a second comparator which compares the second detection voltage and the second reference level, and outputs a second comparison signal based on a comparison result thereof; and
- a logic circuit which outputs the detection signal at the first level during the blank period when at least one of the first comparison signal and the second comparison signal is activated at the first level.

7. The voltage generation circuit of claim 1, wherein the voltage generator stops generating the internal driving voltage in response to the over-current detection signal.

8. The voltage generation circuit of claim 1, further comprising:
- a memory,
- wherein the over-current detection circuit outputs an over-current information signal corresponding to the voltage terminal, through which an over-current flows, and
- the memory stores the over-current information signal.

9. The voltage generation circuit of claim 1, wherein the glitch remover comprises:
- a delay circuit which receives the detection signal and outputs a delayed detection signal, wherein the delayed detection signal is the detection signal, which is received after a masking delay time elapses from a time point at which the detection signal is activated; and
- a keeping counter which performs a count-up operation during a time period, in which the delayed detection signal is maintained at the first level, and outputs the noise detection signal when a counted value corresponds to a keeping time,
- wherein the keeping counter is reset when a time period during which the delayed detection signal is not maintained at the first level is equal to or longer than a predetermined time period.

10. The voltage generation circuit of claim 1, wherein the noise filter comprises a counter which receives a vertical start signal, performs a count-up operation in synchronization with the noise detection signal during a predetermined period of the vertical start signal, and activates the over-current detection signal when a counted value reaches a predetermined value.

11. The voltage generation circuit of claim 1, wherein the current detector comprises:
- a voltage output circuit which converts the internal driving voltage to an output driving voltage at a constant level and outputs the output driving voltage to an output node; and
- a protection circuit connected between the output node and the voltage terminal,
- wherein the protection circuit outputs the detection signal at the first level when the voltage corresponding to the output current of the voltage terminal is lower than the first reference level or higher than the second reference level during the blank period.

12. The voltage generation circuit of claim 11, wherein the protection circuit comprises:
- a first resistor connected between the output node and the voltage terminal;
- a second resistor connected between the output node and a first node;
- a third resistor connected between the first node and a ground terminal;
- a fourth resistor connected between the output node and a second node;
- a fifth resistor connected between the second node and the ground terminal;
- a first comparator which compares the first node and the second node and outputs a detection voltage based on a comparison result thereof;
- a second comparator which compares the detection voltage with the first reference level and outputs a first comparison signal based on a comparison result thereof;
- a third comparator which compares the detection voltage with the second reference level and outputs a second comparison signal based on a comparison result thereof; and
- a logic circuit which outputs the detection signal at the first level during the blank period when at least one of the first comparison signal and the second comparison signal is activated at the first level.

13. The voltage generation circuit of claim 1, wherein the current detector comprises:
- a comparator which compares the internal driving voltage and the driving voltage and outputs an output voltage based on a comparison result thereof;
- a first output transistor comprising a first electrode which receives a power voltage, a second electrode connected to the voltage terminal, and a gate electrode which receives the output voltage;
- a second output transistor comprising a first electrode connected to the voltage terminal, a second electrode connected to a ground terminal, and a gate electrode which receives the output voltage;
- a first comparator which compares a voltage of the first electrode of the first output transistor and a voltage of the second electrode of the first output transistor, and output a detection voltage based on a comparison result thereof;
- a second comparator which compares the detection voltage with the second reference level, and outputs a first comparison signal based on a comparison result thereof;
- a third comparator which compares a voltage of the first electrode of the second output transistor with the first reference level, and outputs a second comparison signal based on a comparison result thereof; and
- a logic circuit which outputs the detection signal at the first level during the blank period when at least one of the first comparison signal and the second comparison signal is activated at the first level.

14. A voltage generation circuit comprising:
- a voltage terminal which outputs a driving voltage; and
- a voltage generation unit which generates the driving voltage to the voltage terminal, wherein the voltage generation unit comprises:
  - a voltage generator which generates an internal driving voltage; and
  - an over-current detection circuit which converts the internal driving voltage to the driving voltage to provide the driving voltage to the voltage terminal, detects an output current flowing through the voltage terminal, and outputs an over-current detection signal,
- wherein the over-current detection circuit comprises:

a voltage output circuit which converts the internal driving voltage to the driving voltage at a constant level and outputs the driving voltage at the constant level to the voltage terminal;

a detection circuit which outputs a first detection voltage and a second detection voltage corresponding to the output current; and a protection circuit which outputs the over-current detection signal when the first detection voltage is lower than a first reference level or when the second detection voltage is higher than a second reference level.

15. The voltage generation circuit of claim 14, wherein the voltage output circuit comprises:

a comparator which compares the internal driving voltage and the driving voltage to output an output voltage based on a comparison result thereof;

a first output transistor comprising a first electrode which receives a first power voltage, a second electrode connected to the voltage terminal, and a gate electrode which receives the output voltage; and a second output transistor comprising a first electrode connected to the voltage terminal, a second electrode connected to a ground terminal, and a gate electrode which receives the output voltage.

16. The voltage generation circuit of claim 15, wherein the detection circuit comprises:

a first mirror transistor comprising a first electrode receiving a second power voltage, a second electrode, and a gate electrode which receives the output voltage;

a first resistor connected between the second electrode of the first mirror transistor and the ground terminal;

a second mirror transistor comprising a first electrode which receives the second power voltage, a second electrode, and a gate electrode connected to the second electrode;

a second resistor connected between the second electrode of the second mirror transistor and the ground terminal; and a third mirror transistor comprising a first electrode connected to the second electrode of the second mirror transistor, a second electrode connected to the ground terminal, and a gate electrode which receives the output voltage, wherein a voltage of the second electrode of the first mirror transistor is the first detection voltage, and a voltage of the second electrode of the second mirror transistor is the second detection voltage.

17. A display device comprising:

a display panel comprising a plurality of gate lines, a plurality of data lines, and a plurality of pixels, each of which is connected to a corresponding gate line of the gate lines and a corresponding data line of the data lines;

a gate driving circuit which drives the gate lines;

a data driving circuit which drives the data lines;

a driving controller which controls the gate driving circuit and the data driving circuit in response to a control signal and an image signal, which are provided thereto from an external source, and outputs a blank signal and a vertical start signal; and a voltage generation circuit which operates in synchronization with the blank signal and the vertical start signal, and generates a driving voltage to drive the gate driving circuit and the data driving circuit, wherein the voltage generation circuit comprising:

a voltage terminal which outputs the driving voltage;

a voltage generator which generates an internal driving voltage; and an over-current detection circuit which converts the internal driving voltage to the driving voltage to provide the driving voltage to the voltage terminal, detects an output current flowing through the voltage terminal during a blank period, in which the blank signal is activated, and outputs an over-current detection signal, wherein the over-current detection circuit comprising:

a current detector which outputs a detection signal at a first level when a voltage corresponding to the output current is lower than a first reference level or higher than a second reference level;

a glitch remover which outputs a noise detection signal when a time period, during which the detection signal is maintained at the first level, is longer than a reference maintenance time period; and a noise filter which activates the over-current detection signal when the noise detection signal is activated at least twice during a predetermined time period.

18. The display device of claim 17, wherein the current detector comprises:

a voltage output circuit which converts the internal driving voltage to the driving voltage at a constant level to provide the driving voltage to the voltage terminal;

a detection circuit which outputs a first detection voltage and a second detection voltage corresponding to the output current; and a protection circuit which outputs the detection signal at the first level when a voltage level of the first detection voltage is lower than the first reference level or when a voltage level of the second detection voltage is higher than the second reference level.

19. The display device of claim 18, wherein the voltage output circuit comprises:

a comparator which compares the internal driving voltage and the driving voltage to output an output voltage;

a first output transistor comprising a first electrode which receives a first power voltage, a second electrode connected to the voltage terminal, and a gate electrode which receives the output voltage; and a second output transistor comprising a first electrode connected to the voltage terminal, a second electrode connected to a ground terminal, and a gate electrode which receives the output voltage.

20. The display device of claim 19, wherein the detection circuit comprises:

a first mirror transistor comprising a first electrode which receives a second power voltage, a second electrode, and a gate electrode which receives the output voltage;

a first resistor connected between the second electrode of the first mirror transistor and the ground terminal;

a second mirror transistor comprising a first electrode which receives the second power voltage, a second electrode, and a gate electrode connected to the second electrode;

a second resistor connected between the second electrode of the second mirror transistor and the ground terminal;

a third mirror transistor comprising a first electrode which receives the second power voltage, a second electrode connected to a first node, and a gate electrode connected to the gate electrode of the second mirror transistor; and a fourth mirror transistor comprising a first electrode connected to the first node, a second electrode connected to the ground terminal, and a gate electrode connected to an output terminal of the comparator,
wherein a voltage of the second electrode of the first mirror transistor is the first detection voltage, and a voltage of the second electrode of the second mirror transistor is the second detection voltage.

* * * * *